United States Patent [19]
Kim

[11] Patent Number: 6,015,721
[45] Date of Patent: Jan. 18, 2000

[54] METHOD OF MANUFACTURING AN AVALANCHE PHOTODIODE

[75] Inventor: Don-Soo Kim, Ich'on, Rep. of Korea

[73] Assignee: Hyundai Electronics Industries Co., Ltd., Kyoungki-do, Rep. of Korea

[21] Appl. No.: 08/997,422

[22] Filed: Dec. 23, 1997

[30] Foreign Application Priority Data

Dec. 30, 1996 [KR] Rep. of Korea ................. 96-77717

[51] Int. Cl.⁷ .................................................. H01L 21/00
[52] U.S. Cl. ........................................... 438/91; 438/93
[58] Field of Search .......................... 438/91, 93, 94

[56] References Cited

U.S. PATENT DOCUMENTS

| | | | |
|---|---|---|---|
| 5,057,891 | 10/1991 | Torikai | 357/30 |
| 5,343,055 | 8/1994 | Davis et al. | 257/186 |
| 5,596,186 | 1/1997 | Kobayashi | 250/214.1 |
| 5,843,804 | 12/1998 | Su et al. | 438/91 |

FOREIGN PATENT DOCUMENTS 62-261182 11/1987 Japan .

*Primary Examiner*—Joni Chang
*Attorney, Agent, or Firm*—Ware, Fressola, Van Der Sluys & Adolphson LLP

[57] ABSTRACT

A method of manufacturing an avalanche photodiode capable of effectively preventing edge breakdown is disclosed. First, so as to manufacture an avalanche photodiode an absorption layer, a grading layer, a charge sheet layer of a first conductivity type and a multiplying layer are formed in sequence on a compound semiconductor substrate of the first conductivity type. Then, a concave portion is formed within multiplying layer at the central portion thereof. A first diffusion layer of the second conductivity type is formed to a first thickness within the multiplying layer so as to surround the concave portion. Next, a second diffusion layer of second conductivity type is formed within the multiplying layer to a second depth deeper than the first depth by extending the first diffusion layer and simultaneously a floating guard-ring, separated from the second diffusion with a selected distance is formed within the multiplying layer. A passivation layer on the multiplying layer is formed such that the second diffusion layer including the concave portion and an adjacent portion thereto is exposed. An ohmic contact layer of the second conductivity type making an ohmic contact with a selected portion of the second diffusion layer.

20 Claims, 5 Drawing Sheets

METHOD OF MANUFACTURING AN AVALANCHE PHOTODIODE

BACKGROUND OF THE INVENTION

1. Field of the Invention

This invention relates to a method of manufacturing an avalanche photodiode and particularly to a method of manufacturing an avalanche photodiode capable of effectively preventing edge breakdown.

2. Description of the Related Art

Light receiving device is used as an essential element in optical communication systems and serves as converting a photo signal transferred via a optical fiber to an electrical signal. Among semiconductor device as such a light receiving device, there is a photodiode and among III–V compound semiconductors there are p-i-n photodiode and an avalanche photodiode (hereinafter "APD").

Generally, in APD, carriers generated by incident light collide with each other via a collision ionization and thus another carrier is generated.

However, in APD, as an edge portion curvature of a pn junction is smaller than a center portion curvature thereof, the electric field of the edge portion becomes higher than that of the center portion due to a very high reverse voltage applied in order to generate an avalanche breakdown. Accordingly, there is problem that, when a reverse bias is applied to the p-n junction, the electric field will be readily concentrate in the circumferential part of the diffused region, resulting in an earlier breakdown than in central part of the diffused region, which is closer to the light receiving area. This phenomenon is known as edge breakdown. To prevent this edge breakdown, there are proposed an structure in which the circumference of the diffused region is surrounded by a guard-ring of a linearly graded p-n junction, whose breakdown voltage is relatively high and other structure having a partial charge sheet.

FIGS. 1 to 3 are cross-sectional views showing prior art APDs for preventing edge breakdown.

FIG. 1 is a cross-sectional view of an APD having a partial charge layer. Referring to FIG. 1, an u-InGaAs absorption layer 2 and an u-InGaAsP grading layer 3 are successively formed on one surface of a n$^+$-InP substrate 1. On the u-InGaAsP grading layer 3 is formed a partial charge sheet layer 4 in order to prevent edge breakdown. The partial charge sheet layer 4 is thicker in the central part than in the other parts. An u-InP multiplying layer 5 is formed on the partial charge sheet layer 4 and a p$^+$-InP diffusion layer 6 is formed in the central part of the u-InP multiplying layer 5. To expose the p$^+$-InP diffusion layer 6, a passivation layer 7 is formed on the u-InP multiplying layer 5 and a p-type ohmic contact layers 8 are formed at both sides on the surface of the p$^+$-InP diffusion layer 6. A n-type ohmic contact layer 9 is formed all over the lower face of the n$^+$-InP substrate 1.

FIG. 2 is a cross-sectional view of an APD having floating guard-rings. Referring to FIG. 2, an u-InGaAs absorption layer 12 and a grading layer 13 are successively formed on an InP substrate 11. Then, a charge sheet layer 14 is formed on the surface of the u-InGaAsP grading layer 13. On the surface of the charge sheet layer 14 is formed an u-InP multiplying layer 15 and within the central part of the u-InP multiplying layer 15 is formed a p$^+$-InP diffusion layer 16. Then, a plurality of guard-rings 17a and 17b are formed such that they are separated from the p$^+$-InP diffusion layer 16 within the u-InP multiplying layer 15 and that they are separated from each other. On the surface of the u-InP multiplying layer 15 is formed a passivation layer 18 such that the p$^+$-InP diffusion layer 16 is exposed. On both sides of the surface of the p$^+$-InP diffusion layer 16 are p-type ohmic contact layers 19 which make ohmic contact with the p$^+$-InP diffusion layer 16. A n-type ohmic contact layer 20 which make ohmic contact with the n$^+$-InP substrate 11 is formed all over the lower face of the n$^+$-InP substrate 11.

FIG. 3 is a cross-sectional view of an APD having a guarding-ring. Referring to FIG. 3, on the surface of a n$^+$-InP substrate 21 are sequentially formed an u-InGaAs absorption layer 22 and a grading layer 23. A charge sheet layer 24 is formed on the surface of the u-InGaAsP grading layer 23 and an u-InP multiplying layer 25 is formed on the charge sheet layer 24. Then, within a central part of the u-InP multiplying layer 25 is formed a p$^+$-InP diffusion layer 26. To prevent edge breakdown, a guard-ring 27 is formed along the peripheral portion of the p$^+$-InP diffusion layer 26. On the surface of the u-InP multiplying layer 25 is formed a passivation layer 28 such that the p$^+$-InP diffusion layer 26 is exposed. Ohmic contact layers 29 which make ohmic contact with the p$^+$-InP diffusion layer 26 are formed on both sides of the surface of the p$^+$-InP diffusion layer 26. A n-type ohmic contact layer 30 is formed all over the lower face of the n$^+$-InP substrate 21.

As shown in FIGS. 1 to 3, a prior art APD comprises the partial charge sheet layer 14, and the floating guard-rings 17a and 17b. Alternatively, the prior art APD comprises a partial charge sheet layer 14 and a guard-ring 27. Such the partial charge sheet layer 14, the floating guard-rings 17a and 17b and the guard-ring 27 absorb an electric field at the edge portion of a pn junction face which is a junction face between the u-InP multiplying layer 5, 15, or 25 and p$^+$-InP diffusion layer 6, 16, or 26 and make an electric field higher in the central portion of the pn junction than in the edge portion thereof. Therefore, an avalanche breakdown occurs effectively at the central portion of the pn junction.

However, there are the following problems in the prior art APD as described above.

In APD having a partial charge sheet layer (refer to FIG. 1), the charge sheet layer is grown on the u-InGaAsP grading layer 3 by epitaxial growth and etched to form the partial charge sheet layer 4. Then, as the u-InP multiplying layer 5 is again grown on the partial charge sheet layer 4 by epitaxial growth, two epitaxial growth processes are required. Due to such two epitaxial growth, a defect at the interface between the partial charge sheet layer 4 and u-InP multiplying layer 5 occurs and the characteristics of APD thus decrease. Also, at the step of etching the charge sheet layer, it is difficult to accurately control the etching depth of the charge sheet layer.

In APD having a floating guard-ring (refer to FIG. 2), to form two floating guard-rings 17a and 17b, two or more diffusion processes are performed. At this time, as it is difficult to control diffusion process, it is hard to obtain APD having the superior characteristics.

In APD having the guard-ring as shown in FIG. 3, to form the guard-ring 27, two diffusion processes are performed. That is to say, after the first diffusion process utilizing Zn and Cd as diffusion source is performed, the second diffusion process utilizing Be as diffusion source is performed. At this time, as the exact doping control is difficult, there occurs the difficulty in the process.

SUMMARY OF THE INVENTION

An object of this invention, therefore, is to provide a method for forming a smooth graded pn junction at an edge part capable of preventing effectively edge breakdown in APD.

To accomplish this above object, so as to manufacture an avalanche photodiode, an absorption layer, a grading layer, a charge sheet layer of a first conductivity type and a multiplying layer are formed in sequence on a compound semiconductor substrate of the first conductivity type. Then, a concave portion is formed within the multiplying layer at the central portion thereof. A first diffusion layer of a second conductivity type is formed to a first depth within the multiplying layer so as to surround the concave portion. Next, a second diffusion layer of the second conductivity type is formed within the multiplying layer to a second depth deeper than the first depth by extending the first diffusion layer and simultaneously a floating guard-ring, separated from the second diffusion with a selected distance is formed within the multiplying layer. A passivation layer on the multiplying layer is formed such that the second diffusion layer including the concave portion and an adjacent portion thereof is exposed. An ohmic contact layer of the second conductivity type making an ohmic contact with a selected portion of the second diffusion layer at the exposed adjacent portion of the concave portion of the second diffusion layer is formed. Then, an ohmic contact layer of the first conductivity type all over the lower face of the compound substrate is formed.

According to this invention, the concave portion at the central portion of the multiplying layer of the avalanche photodiode is formed and the diffusion layer within the multiplying layer is formed by performing two diffusion process utilizing the concave portion. Accordingly, a smooth graded pn junction face between the multiplying layer and the diffusion layer is formed at even a edge portion and thus an electric field becomes higher at the central portion than at the edge portion. Therefore, edge breakdown is effectively prevented particularly by a floating guard-ring.

DETAILED DESCRIPTION OF THE INVENTION

Hereinafter, an embodiment will be described with reference to FIGS. 4A to 4F.

Figure 1:
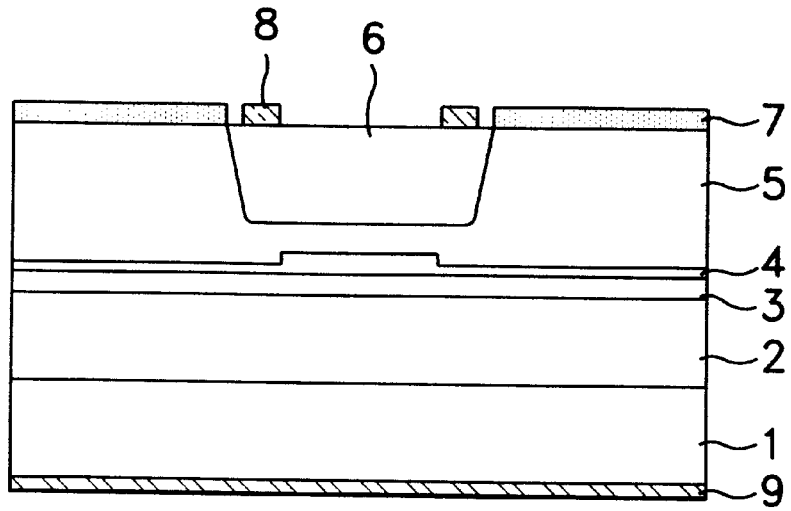
FIG. 1 shows a cross-sectional view of APD having a partial charge sheet layer in the prior art.
Figure 2:
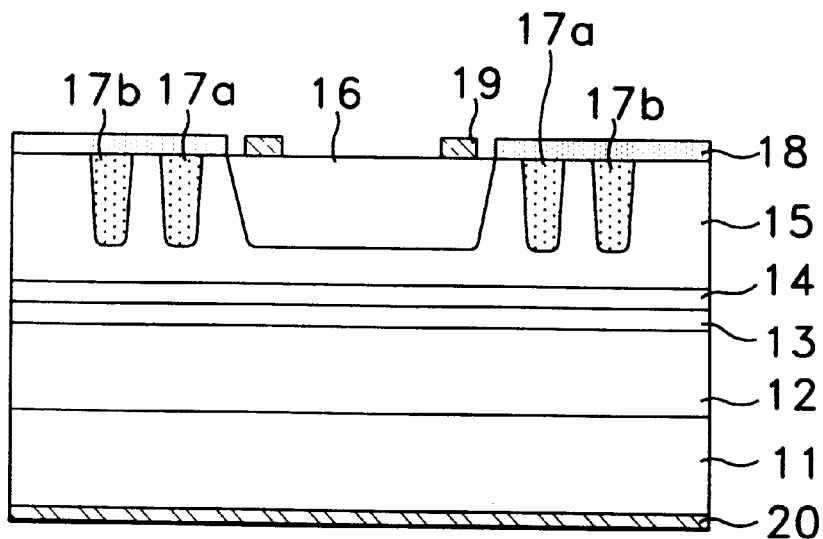
FIG. 2 show cross-sectional view of APD having a floating guard-ring in the prior art.
Figure 3:
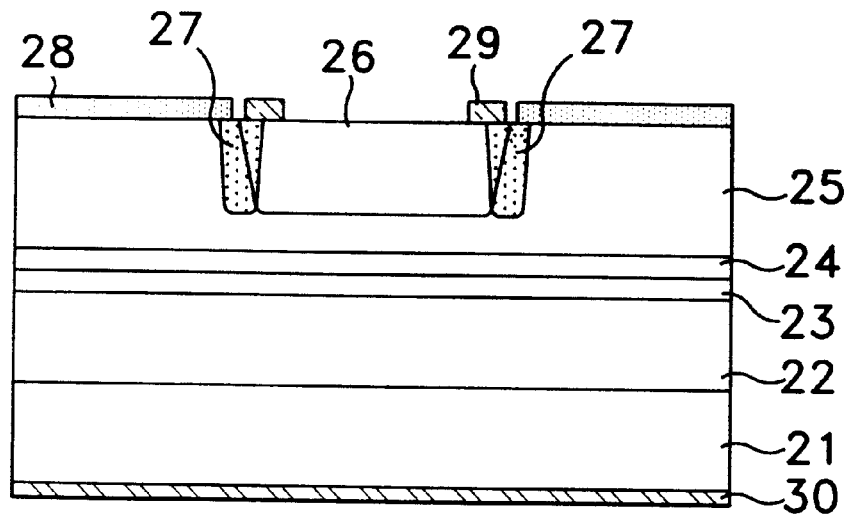
FIG. 3 shows a cross-sectional view of APD having a guard-ring in the prior art.
Figure 4A:
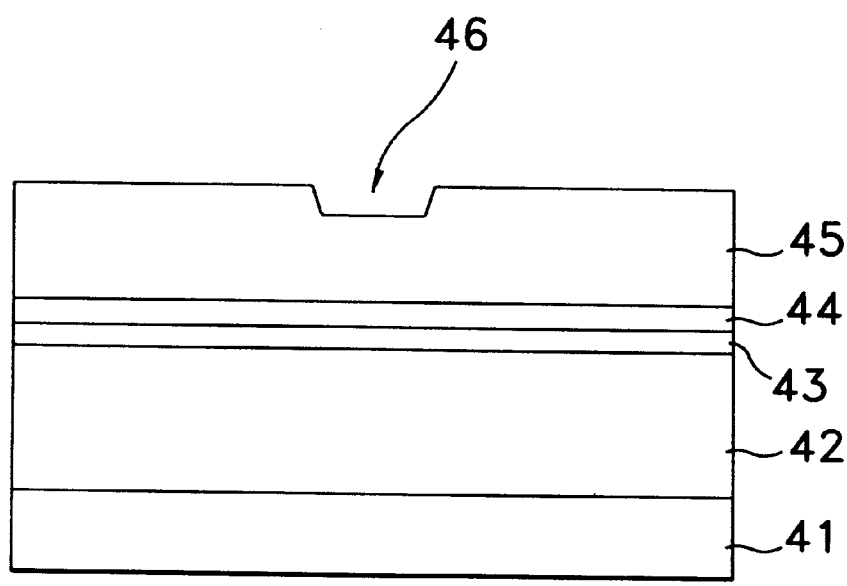
FIGS. 4A to 4F show cross-sectional views for explaining a method of manufacturing APD according to an embodiment in this invention.

Referring to FIG. 4A, on a $n^+$-InP substrate 41 are sequentially formed an u-InGaAs absorption layer 42, a grading layer 43, a n-InP charge sheet layer 44 and an u-InP multiplying layer 45 by epitaxial growth. Then, the u-InP multiplying layer 45 is etched at a selected central portion thereof to form a concave portion 46.

Figure 4B:
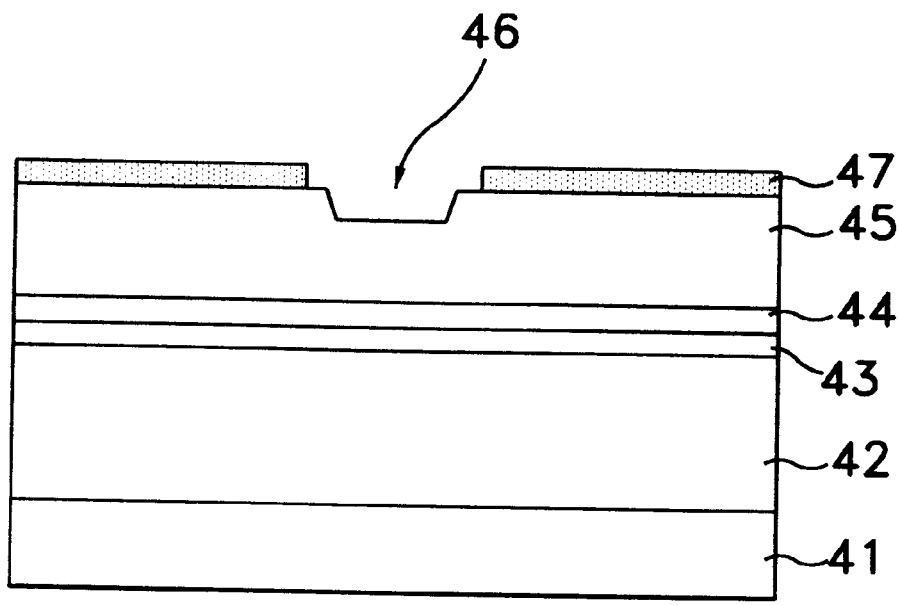

Referring to FIG. 4B, a first insulating material, preferably a dielectric material, is deposited on the surface of the resultant structure of FIG. 4A, and is patterned such that a selected portion of the u-InP multiplying layer 45 including the concave portion 46 is exposed, thus to form a first insulating film 47.

Figure 4C:
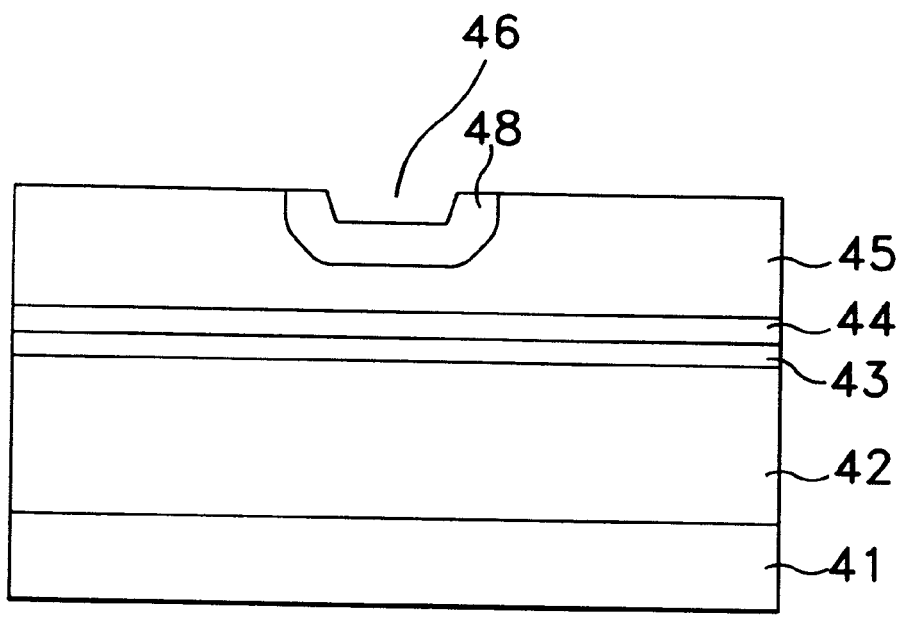

Referring to FIG. 4C, firstly, Zn or Cd is diffused within the exposed u-InP multiplying layer 45 by the known diffusion process, utilizing the first insulating film 47 as a diffusion mask and a first $p^+$-InP diffusion layer 48 surrounding a peripheral portion of the concave portion 46 is thus formed. At this time, due to the concave portion 46 a junction face between the first $p^+$-InP diffusion layer 48 and the u-InP multiplying layer 45 is formed with a smooth-grade. Then, the first insulating film 47 is removed according to the prior art method.

Figure 4D:
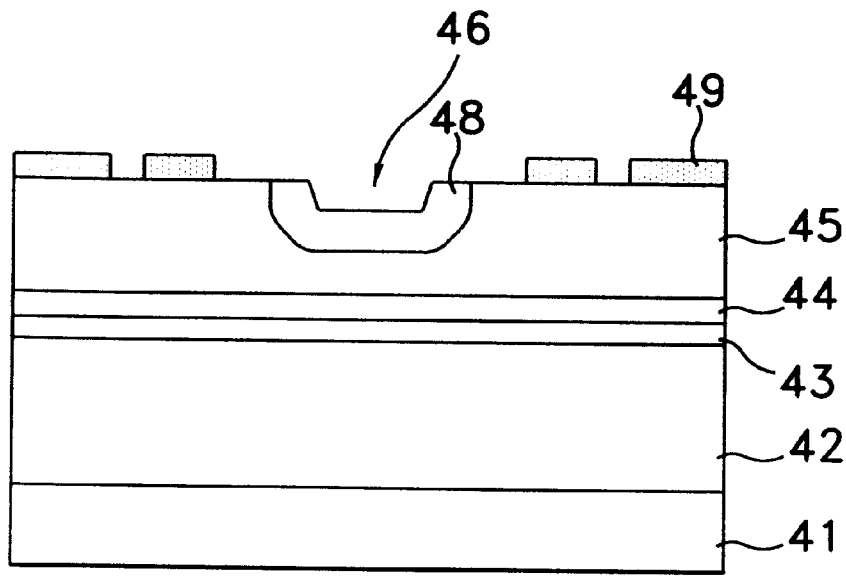

Referring to FIG. 4D, a second insulating material, preferably a dielectric material, is deposited on the surface of the structure of FIG. 4C and is patterned such that the first $p^+$-InP diffusion layer 46, a first portion of the u-InP multiplying layer 45 adjacent thereto, and a second portion of the u-InP multiplying layer 45 separated from the first portion of the multiplying layer 45, are exposed, thus to form a second insulating film 49.

Figure 4E:
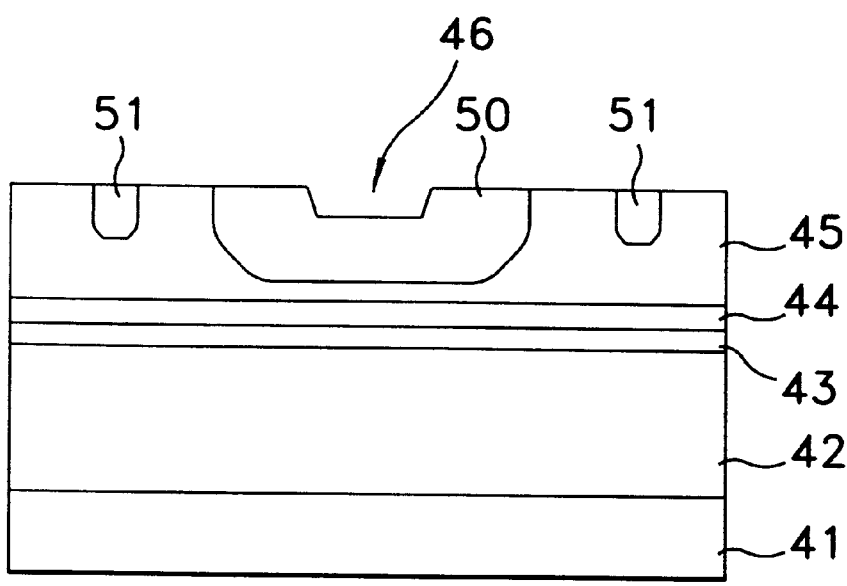

Referring to FIG. 4E, secondly, Zn or Cd is diffused within the exposed u-InP multiplying layer 45, utilizing the second insulating film 49 as a diffusion mask according to the known diffusion process. As the result, the first $p^+$-InP diffusion layer 48 surrounding the concave portion 46 is extended into the u-InP multiplying layer 45 to form a second $p^+$-InP diffusion layer 50 and a floating guard-ring 51 is formed at an outer portion separated from the second $p^+$-InP diffusion layer 50. At this time, due to the concave portion 46 a pn junction which is a junction face between the second $p^+$-InP diffusion layer 50 and the u-InP multiplying layer 45 is formed with gentle grade, and the second $p^+$-InP diffusion layer 50 and the floating guard-ring 51 are isolated electrically to each other. Moreover, the floating guard-ring 51 serves as preventing edge breakdown by absorbing an electric field at edge portion of the pn junction face when a selected reverse bias voltage is applied to APD. Thereafter, the second insulating film 49 is removed.

Figure 4F:
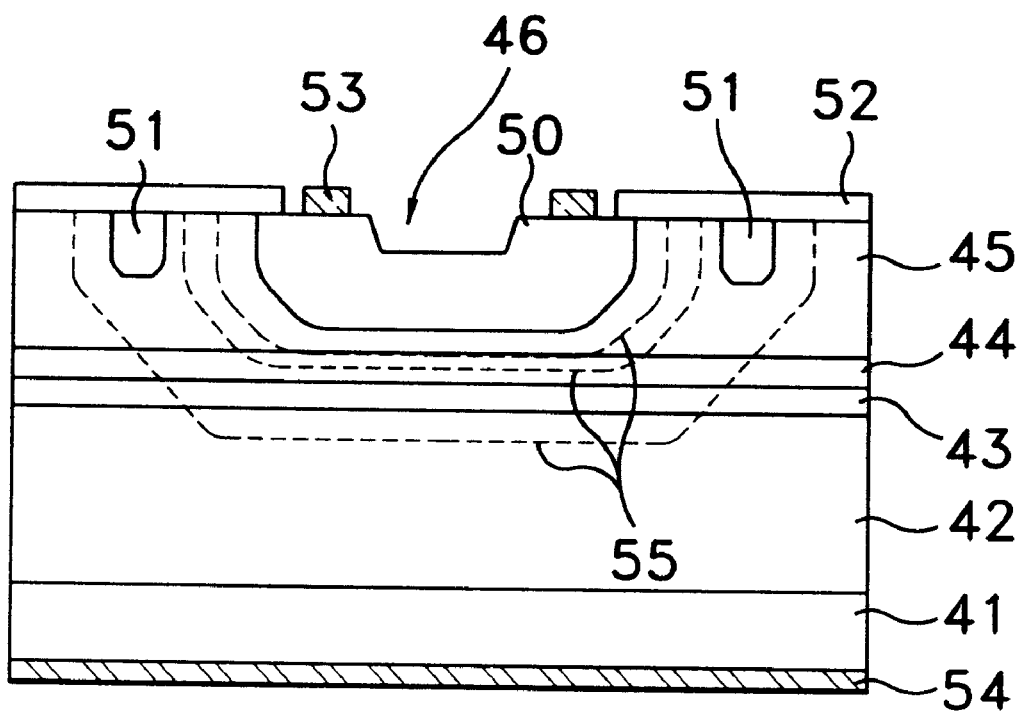

Referring to FIG. 4F, a passivation material is deposited on the surface of structure of FIG. 4E and is patterned such that the second $p^+$-InP diffusion layer 50 is exposed, to form a passivation layer 52. Then, a p-type ohmic metal layer 53 which makes ohmic contact with the $p^+$-InP diffusion layer 50 is formed on the surface of the $p^+$-InP diffusion layer 50 of the adjacent portion to the concave portion 46. N-type ohmic contact layer 54 which makes ohmic contact with the $n^+$-InP substrate 41 is formed all over the lower face of the $n^+$-InP substrate 41.

Furthermore, in FIG. 4F, numeral 55 indicates equivalent potential curves according to the application of voltage, wherein the gap between them is narrower in the central portion than in the edge portion. That is to say, the electric field is higher at the central portion of APD than at the edge portion thereof. Therefore, edge breakdown phenomenon is prevented.

According to the above embodiment, the concave portion at the central portion of the multiplying layer of APD is formed, and two diffusion processes are performed by utilizing the concave portion so that the diffusion layer within the multiplying layer is formed. Accordingly, the gentle-graded p-n junction face between the multiplying layer and diffusion layer is formed at the edge portion. Therefore, the electric field becomes higher at the central portion than at the edge portion when a voltage is applied, and thus edge breakdown can be prevented. Such edge breakdown phenomenon can be still more effectively prevented by the floating guard-ring. At this result, the characteristics of APD is enhanced by generating effectively break-down at the central portion.

Furthermore, the number of the process for forming the floating guard-ring and the diffusion layer decreases, so that the process becomes simplified and the cost of manufacturing the APD thus decreases.

Although the preferred embodiment of this invention has been disclosed for illustrative purpose, those skilled in the art will appreciate that various modifications, additions and substitutions are possible, without from the scope and spirit of the invention as described in the accompanying claims.

What is claimed is:

1. A method of manufacturing an avalanche photodiode comprising the steps of:

forming an absorption layer, a grading layer, a charge sheet layer of a first conductivity type and a multiplying layer in sequence on compound semiconductor substrate of the first conductivity type;

forming a concave portion within the multiplying layer at the central portion thereof;

forming a first diffusion layer of a second conductivity type to a first depth within the multiplying layer so as to surround the concave portion; and forming a second diffusion layer of the second conductivity type within the multiplying layer to a second depth deeper than the first depth by extending the first diffusion layer and simultaneously with forming a floating guard-ring within the multiplying layer, separated from the second diffusion with a selected distance, whereby a junction face between the second diffusion layer and the multiplying layer is formed with a gentle grade at the edge portion of the junction face.

2. The method of claim 1, further comprising the steps of: after forming the second diffusion layer and the floating guard-ring within the multiplying layer, forming a passivation layer on the multiplying layer such that the second diffusion layer including the concave portion and an adjacent portion thereof is exposed;

forming an ohmic contact layer of the second conductivity type making an ohmic contact with a selected portion of the second diffusion layer at the exposed adjacent portion of the concave portion of the second diffusion layer; and forming an ohmic contact layer of the first conductivity type all over the lower face of the compound substrate.

3. The method of claim 1, wherein the step of forming the first diffusion layer comprises:

forming an insulating film on the multiplying layer;

patterning the insulating film such that a selected portion of the multiplying including the concave portion is exposed;

diffusing a selected impurity to a first depth within the exposed multiplying layer, utilizing the insulating film as a first diffusion mask; and removing the insulating layer.

4. The method of claim 3, wherein the impurity is zinc.

5. The method of claim 3, wherein the impurity is cadmium.

6. The method of claim 1, wherein the step of forming the second diffusion layer and the floating guard-ring comprises:

forming an insulating layer all over the surfaces of the multiplying layer and the first diffusion layer;

patterning the insulating layer to expose the first diffusion layer, a first portion of the multiplying layer adjacent thereto, and a second portion of the multiplying layer separated from the first portion of the multiplying layer with a selected distance, to form an insulating film;

diffusing an impurity within the exposed first diffusion layer, the first portion and the second portion of the multiplying layer, using the insulating film as a second diffusion mask as much as the second thickness; and removing the insulating film.

7. The method of claim 6, wherein the impurity is zinc.

8. The method of claim 6, wherein the impurity is cadmiun.

9. The method of claim 1, wherein the compound semiconductor substrate of the first conductivity type is formed of $n^+$-InP.

10. The method of claim 1, wherein the absorption layer is formed of u-InGaAs.

11. The method of claim 1, wherein the grading layer is formed of InGaAsP.

12. The method of claim 1, wherein the multiplying layer is formed of u-InP.

13. The method of claim 1, wherein the first diffusion layer of the second conductivity type and the second diffusion layer of the second conductivity type all are formed of $p^+$-InP.

14. The method of claim 9, wherein the absorption layer is formed of u-InGaAs.

15. The method of claim 14, wherein the grading layer is formed of InGaAsP.

16. The method of claim 15, wherein the multiplying layer is formed of u-InP.

17. The method of claim 16, wherein the first diffusion layer of second conductivity type and the second diffusion layer of the second conductivity type all are formed of $p^+$-InP.

18. The method of claim 2, wherein the compound semiconductor substrate of the first conductivity type is formed of $n^+$-InP, the absorption layer is formed of u-InGaAs.

19. The method of claim 2, wherein the grading layer is formed of InGaAsP, the multiplying layer is formed of u-InP, and the first diffusion layer of the second conductivity type and the second diffusion layer of the second conductivity type all are formed of $p^+$-InP.

20. The method of claim 18, wherein the grading layer is formed of InGaAsP, the multiplying layer is formed of u-InP, and the first diffusion layer of the second conductivity type and the second diffusion layer of the second conductivity type all are formed of $p^+$-InP.

UNITED STATES PATENT AND TRADEMARK OFFICE
CERTIFICATE OF CORRECTION

PATENT NO. : 6,015,721
DATED : January 18, 2000
INVENTOR(S) : D. Kim

It is certified that error appears in the above-identified patent and that said Letters Patent is hereby corrected as shown below:

At col. 3, line 40, please cancel "show" and substitute --shows-- therefor.

Signed and Sealed this

Twenty-sixth Day of December, 2000

Attest:

Q. TODD DICKINSON

*Attesting Officer*  *Director of Patents and Trademarks*